US009801316B2

(12) United States Patent
Youn

(10) Patent No.: US 9,801,316 B2
(45) Date of Patent: Oct. 24, 2017

(54) ELECTRONIC DEVICE AND BOARD USABLE IN THE ELECTRONIC DEVICE

(75) Inventor: Jae-sub Youn, Anyang-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 13/599,026

(22) Filed: Aug. 30, 2012

(65) Prior Publication Data

US 2013/0057994 A1 Mar. 7, 2013

(30) Foreign Application Priority Data

Sep. 6, 2011 (KR) .............. 2011-0090376

(51) Int. Cl.
*H05K 9/00* (2006.01)
*H02H 9/00* (2006.01)
*H02H 9/04* (2006.01)

(52) U.S. Cl.
CPC .............. *H05K 9/0067* (2013.01); *H02H 9/00* (2013.01); *H02H 9/005* (2013.01); *H02H 9/046* (2013.01)

(58) Field of Classification Search
CPC ............ H02H 9/005; H02H 9/04–9/06; H05K 1/0215; H05K 9/0067; H01C 7/12
USPC ........................................................ 361/56
See application file for complete search history.

(56) References Cited

U.S. PATENT DOCUMENTS

| 4,807,083 | A | * | 2/1989 | Austin ........................... 361/111 |
| 5,124,873 | A | * | 6/1992 | Wheeler et al. ................ 361/58 |
| 7,085,118 | B2 | | 8/2006 | Inoue et al. |
| 2004/0233606 | A1 | | 11/2004 | Inoue et al. |
| 2005/0243486 | A1 | * | 11/2005 | Wingfield et al. .............. 361/56 |
| 2007/0097585 | A1 | * | 5/2007 | Sung et al. ......... H04M 1/0202 361/118 |
| 2009/0116156 | A1 | | 5/2009 | Yoshinaga et al. |
| 2009/0168280 | A1 | | 7/2009 | Huang et al. |

FOREIGN PATENT DOCUMENTS

| CN | 1542873 | 11/2004 |
| CN | 201063677 | 5/2008 |
| CN | 101297494 | 10/2008 |
| JP | 09-070142 A | 11/1997 |
| RU | 2 360 347 | 6/2009 |

OTHER PUBLICATIONS

Russian Office Action dated Aug. 23, 2016 in Russian Patent Application No. 2012136216.

(Continued)

*Primary Examiner* — Stephen W Jackson
*Assistant Examiner* — Christopher Clark
(74) *Attorney, Agent, or Firm* — Staas & Halsey LLP

(57) ABSTRACT

An electronic device includes an exterior portion of a conductive material, a circuit portion including circuit elements, and a protection circuit portion connected between the exterior portion and the circuit portion. The protection circuit portion includes a switching unit to intercept leakage current that flows from the circuit portion and leaks to the exterior portion, and a conversion unit to reduce a voltage level of an electrostatic component that flows through the exterior portion and to transfer the electrostatic component to the switching unit.

12 Claims, 6 Drawing Sheets

(56) References Cited

OTHER PUBLICATIONS

Chinese Office Action dated Oct. 17, 2016 in Chinese Patent Application No. 201210326053.3.
Chinese Office Action dated May 18, 2016 in Chinese Patent Application No. 201210326053.3.
Russian Office Action dated Dec. 21, 2016 in Russian Patent Application No. 2012136216.
Russian Decision on Grant dated Apr. 18, 2017 in corresponding Russian Patent Application No. 2012136216, (8 pages) (4 pages English Translation).

* cited by examiner

ELECTRONIC DEVICE AND BOARD USABLE IN THE ELECTRONIC DEVICE

CROSS-REFERENCE TO RELATED APPLICATIONS

This application claims priority under 35 U.S.C. §119(a) from Korean Patent Application No. 10-2011-0090376, filed on Sep. 6, 2011, in the Korean Intellectual Property Office, the disclosure of which is incorporated herein by reference in its entirety.

BACKGROUND

1. Field

The present general inventive concept relates to an electronic device and a board usable in the electronic device, and more particularly to an electronic device and a board usable in the electronic device having an electrostatic discharge (ESD) and leakage current protection circuit.

2. Description of the Related Art

A conventional electrostatic discharge (ESD) protection device is installed inside an electronic device in order to prevent damage of an internal circuit due to ESD stress current that flows from a charged human body or machine into an inner portion of a semiconductor device.

As technology progresses with regard to system on chip (SOC), an area occupied by an ESD protection circuit is considered when determining an entire size of a semiconductor chip. Further, the importance of the ESD protection circuit has been gradually increasing since the ESD protection circuit acts as an important factor that determines hip performance.

Conventionally, when an exterior portion of a conductive material is mounted on an exterior portion of an electronic device, ESD protection has been applied in various ways.

For example, a part of an exterior portion of an electronic device may be directly connected to a printed circuit board (PCB) ground or a ground of an adapter to allow ESD that is applied to an external case of a conductive material to be discharged to the ground.

Alternatively, an exterior portion of the electronic device and a ground may be spaced apart from each other without being electrically connected to each other to minimize a secondary influence exerted on a main system when ESD is applied to the exterior portion of a conductive material.

However, the above-mentioned ESD protection methods include the following problems.

When a part of an exterior portion of an electronic device is directly connected to a PCB ground or a ground of an adapter, leakage current of the system flows to the exterior portion of the conductive material through a conductor connected between the exterior portion of the conductive material and the ground.

Also, when minimizing a secondary influence on a system when the ESD is applied to the exterior portion of the conductive material by making the exterior portion of the electronic device and the ground spaced apart from each other without electrically connecting the exterior portion of the electronic device and the ground to each other, the ESD that is applied to the exterior portion of the conductive material is not discharged, and thus an electromagnetic field is generated on a surface of the exterior portion of the conductive material to cause signal distortion on the PCB.

Further, if a user physically approaches the exterior portion of the conductive material in a state where electric charge on the exterior portion of the conductive material has not been discharged, the electric charge on the exterior portion of the conductive material may cause secondary discharge to be transferred to the user resulting in a shock.

SUMMARY

The present general inventive concept provides an electronic device and a board usable in the electronic device, which can minimize an influence caused by an external ESD/surge and can prevent leakage current that occurs inside a system from flowing to an exterior portion of a conductive material and affecting a user.

Additional features and utilities of the present general inventive concept will be set forth in part in the description which follows and, in part, will be obvious from the description, or may be learned by practice of the general inventive concept.

The foregoing and/or other features and utilities of the present general inventive concept may be achieved by providing an electronic device including an exterior portion of a conductive material, a circuit portion including circuit elements, and a protection circuit portion connected between the exterior portion and the circuit portion, the protection circuit portion including a switching unit to intercept leakage current that flows from the circuit portion and leaks to the exterior portion and to transfer an electrostatic component input thereto via the exterior portion to a ground of the circuit portion, and a conversion unit to reduce a voltage level of the electrostatic component and to transfer the voltage-reduced electrostatic component to the switching unit, the switching unit and the conversion unit being connected in series.

The switching unit may be a varistor, and the conversion unit may be a bead connected in series to the varistor.

The switching unit may be a varistor, and the conversion unit may be one of a resistor, an inductor, or and RL circuit having a resistor and an inductor connected in parallel, which is connected in series to the varistor.

The switching unit may be a diode having a cathode connected to the circuit portion, and the conversion unit may be one of a bead, a resistor, an inductor, and an RL circuit having a resistor and an inductor connected in parallel, which is connected to an anode of the diode.

The circuit portion may be mounted on a main board, and the protection circuit portion may be mounted on a sub-board that is provided separately from the main board and may be connected to the circuit portion on the main board and the exterior portion through a conductive tape.

The circuit portion and the protection circuit portion may be mounted together on one main board, and the protection circuit portion may be connected in series between a plastic encapsulated microcircuit (PEM) and the circuit portion on the main board, wherein the PEM connects the exterior portion and the main board.

The exterior portion may be a metal case that surrounds the circuit portion and the protection circuit portion.

The exterior portion may be a metal exterior member that is attached to a plastic case surrounding the circuit portion and the protection circuit portion.

The varistor may have capacitance that is equal to or less than 5 pF.

The foregoing and/or other features and utilities of the present general inventive concept may also be achieved by providing a board usable in an electronic device including a protection circuit portion that is connected between a circuit portion including circuit elements of the electronic device and an exterior portion of a conductive material forming an exterior of the electronic device, the protection circuit portion including a switching unit to intercept leakage current that flows from the circuit portion and leaks to the exterior portion and to transfer an electrostatic component input thereto via the exterior portion to a ground of the circuit portion, and a conversion unit to reduce a voltage level of the electrostatic component and to transfer the voltage-reduced electrostatic component to the switching unit, the switching unit and the conversion unit being connected in series.

The switching unit may be a varistor, and the conversion unit may be a bead connected in series to the varistor.

The switching unit may be a varistor, and the conversion unit may be one of a resistor, an inductor, and an RL circuit having a resistor and an inductor connected in parallel, which is connected in series to the varistor.

The switching unit may be a diode having a cathode connected to the circuit portion, and the conversion unit may be one of a bead, a resistor, an inductor, and an RL circuit having a resistor and an inductor connected in parallel, which is connected to an anode of the diode.

The exterior portion may be one of a metal case that surrounds the circuit portion and the protection circuit portion and a metal exterior member that is attached to a plastic case surrounding the circuit portion and the protection circuit portion.

The varistor may have capacitance that is equal to or less than 5 pF.

The foregoing and/or other features and utilities of the present general inventive concept may also be achieved by providing an electronic device, including a circuit portion to operate the electronic device, and a protection circuit portion coupled between an exterior portion of the electronic device and the circuit portion, including a conversion unit to reduce a voltage of an electrostatic component received from the exterior portion, and a switching unit to direct the electrostatic component with the reduced voltage to a ground of the circuit portion.

The switching unit may intercept a leakage current that flows from the circuit portion and leaks to the exterior portion.

The exterior portion may include a conductive material on at least a portion thereof.

The conversion unit and the switching unit may be connected in series.

The electronic device may further include a main board upon which the circuit portion and the protection circuit portion are mounted, and a plastic encapsulated microcircuit (PEM) to couple the main board to the external portion.

BRIEF DESCRIPTION OF THE DRAWINGS

These and/or other features and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
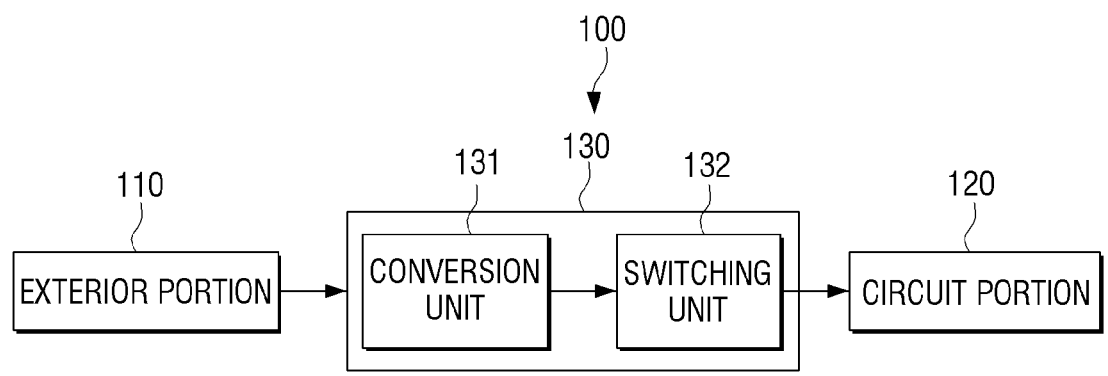
FIG. 1 is a block diagram illustrating an electronic device according to an embodiment of the present general inventive concept.

Reference will now be made in detail to the embodiments of the present general inventive concept, examples of which are illustrated in the accompanying drawings, wherein like reference numerals refer to the like elements throughout. The embodiments are described below in order to explain the present general inventive concept while referring to the figures.

FIG. 1 is a block diagram illustrating an electronic device 100 according to an embodiment of the present general inventive concept. Referring to FIG. 1, the electronic device 100 includes an exterior portion 110, a circuit portion 120, and a protection circuit portion 130, and the protection circuit portion 130 includes a conversion unit 131 and a switching unit 132.

The electronic device 100 may be one of various types of electronic devices, such as a computer, a notebook computer, a TV, a digital photo frame, and a refrigerator, but is not limited thereto. That is, the electronic device 100 may be any type of electronic device connectable to an external power supply through an outlet and a plug. However, the electronic device 100 is not limited thereto and may be an electronic device that is not connected to the external power supply (e.g., a notebook computer driven by a built-in battery).

The exterior portion 110 is made of a conductive material and forms an exterior of the electronic device 100.

The conductive material may include any type of a material through which electricity flows well.

Specifically, the exterior portion 110 is formed of the conductive material through which the electricity flows well, and can direct an electrostatic component that is generated from a charged human body or machine to flow into the protection circuit portion 130 and the circuit portion 120.

The exterior portion 110 may include a metal case that surrounds the circuit portion 120 and the protection circuit portion 130.

Further, the exterior portion 110 may be a metal exterior member that is attached to a plastic case surrounding the circuit portion 120 and the protection circuit portion 130.

The circuit portion 120 includes circuit elements to perform functions according to a type of electronic device 100. For example, where the electronic device 100 is a notebook computer, the circuit portion 120 may include circuits to function as a notebook computer.

Specifically, the circuit portion 120 may include various circuit elements for the operation of the electronic device 100. That is, the circuit portion 120 may include circuit elements, such as a resistor, an inductor, a variable resistor, a capacitor, an LC filter, a ceramic filter, a switch, a wiring plate, a transistor, a diode, a power transistor, an LED semiconductor laser, an analog IC, a digital IC, a DRAM, a microprocessor, etc., but is not limited thereto.

Further, the circuit portion 120 may include a ground to couple the electronic device 100 to ground (i.e., earth).

The protection circuit portion 130 connects the exterior portion 110 of the conductive material and the circuit portion 120 to discharge an electrostatic component to the ground or to intercept leakage current.

The protection circuit portion 130 includes the conversion unit 131 and the switching unit 132.

Specifically, when the electrostatic component that is generated from the charged human body or machine flows through the exterior portion 110, the protection circuit portion 130 transfers the electrostatic component to the ground of the circuit portion 120 that is connected to the protection circuit portion 130. Accordingly, the ground of the circuit portion 120 may discharge the flowing electrostatic component to an area outside the electronic device 100 via the ground of an adaptor (not illustrated). If the circuit portion 120 does not include the ground, the protection circuit portion 130 may be directly connected to the ground of the adaptor (not illustrated) to discharge the flowing electrostatic component be discharged to an area outside the electronic device 100 via the ground of the adaptor.

Further, if the leakage current flows from the circuit portion 120, the protection circuit portion 130 intercepts the leakage current that flows to the exterior portion 110.

Specifically, the protection circuit portion 130 prevents the leakage current that is generated from an area inside the circuit portion 120 or the leakage current that flows through the ground of the adaptor (not illustrated) connected to the ground of the circuit portion 120 from flowing into the exterior portion 110.

The protection circuit portion 130 may be mounted on the main board together with the circuit portion 120 or on a sub-board separately from the main board on which the circuit portion 130 is mounted.

An operation of the protection circuit portion 130 will be described in detail with respect to the conversion unit 131 and the switching unit 132, which are included in the protection circuit portion 130.

The conversion unit 131 reduces a voltage level of the electrostatic component that flows through the exterior portion 110 and transfers the electrostatic component to the switching unit 132.

Specifically, the electrostatic component forms harmonics ranging up to several GHz band, and the conversion unit 131 may reduce the voltage level of the waveform through absorption of high-frequency components of the electrostatic component.

Figure 5A:
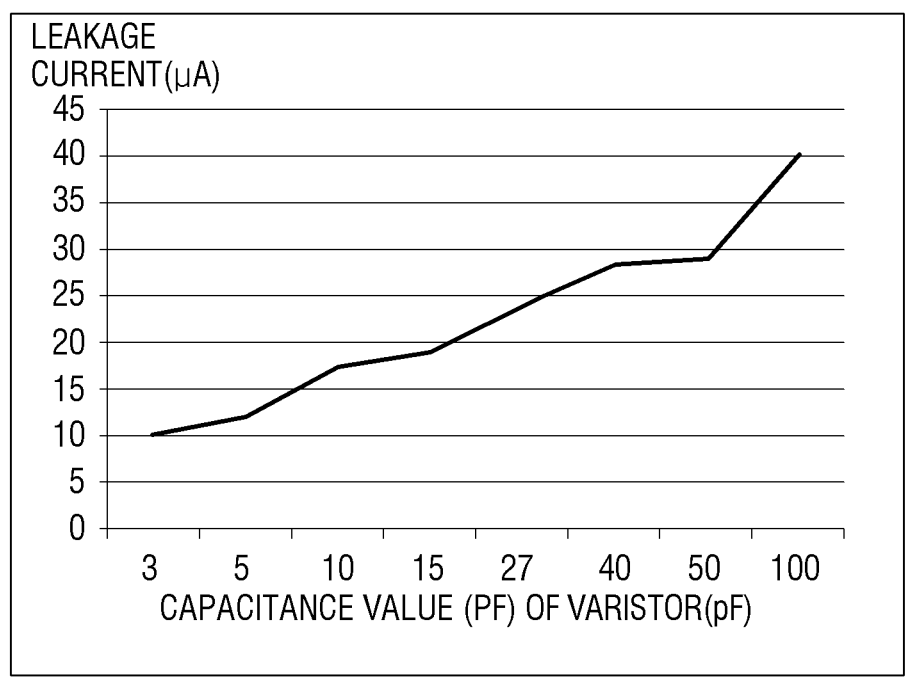
FIG. 5A is a graph illustrating the correlation between capacitance of a varistor and leakage current.
Figure 5B:
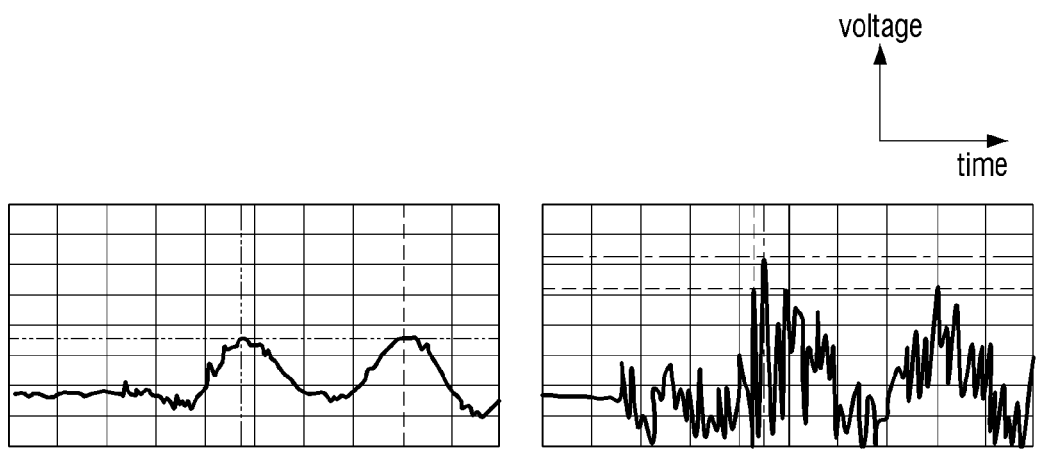
FIG. 5B is a graph illustrating a voltage value applied to a varistor according existence/nonexistence of a bead.

That is, referring to FIG. 5B, a left side of FIG. 5B indicates the voltage level of a bead when ESD is applied to the exterior portion 110 in a state where the bead is connected in series to the varistor, and a right side of FIG. 5B indicates a voltage level of the bead when ESD is applied to the exterior portion 110 through application of the varistor only without the bead.

As illustrated in FIG. 5B, due to the serial connection of the bead to the varistor, the level of the voltage applied to the varistor is decreased.

Accordingly, reducing the voltage level of the electrostatic component that flows through the exterior portion 110 may prevent elements of the switching unit 132 from being damaged when the high-voltage level is input to the switching unit 132, and may also allow use of elements having low capacitance values in the switching portion 132.

The conversion unit 131 may include a bead, a resistor, an inductor, or an RL circuit in which a resistor and an inductor are connected in parallel to each other.

The bead is an element made of a ferrite material, and is configured so that a ferrite core passes through a line or a line wound several times.

The switching unit 132 intercepts the leakage current that flows from the circuit portion 120 and leaks to the exterior portion 110, and transfers the electrostatic component that flows through the exterior portion 110 to the ground of the circuit portion 120 as is.

Specifically, if the electrostatic component that is generated from the charged human body or machine flows through the exterior portion 110, the switching unit 132 transfers the electrostatic component of which the voltage level has been decreased through the conversion unit 131 to the ground of the circuit portion 120 connected to the switching portion 132.

Accordingly, the ground of the circuit portion 120 can discharge the flowing electrostatic component to the area outside the electronic device 100 via the ground of the adaptor (not illustrated). If the circuit portion 120 does not include the ground, the switching unit 132 may be directly connected to the ground of the adaptor (not illustrated) to discharge the flowing electrostatic component to the area outside the electronic device 100 via the ground of the adaptor.

Further, the switching unit 132 prevents the leakage current that is generated from the area inside of the circuit portion 120 or the leakage current that flows through the ground of the adaptor (not illustrated) connected to the ground of the circuit portion 120 from flowing into the exterior portion 110.

Here, the switching unit 132 may be a varistor or a diode.

The varistor is an abbreviation of a variable resistor, and is a semiconductor device having different resistance values according to the input voltage levels. That is, the varistor acts as a nonconductor before the input voltage reaches a predetermined breakdown voltage, and acts as a conductor when the input voltage becomes equal to or higher than the breakdown voltage. Here, the varistor may be a symmetric varistor or an asymmetric varistor.

Further, the varistor may have a capacitance value that is equal to or less than 5 pF.

That is, referring to FIG. 5A, as the capacitance value of the varistor increases, the flowing leakage current becomes larger.

In detail, if the capacitance value of the varistor becomes smaller, the varistor has an effect on the leakage current, but is vulnerable to the electrostatic component, while if the capacitance value of the varistor becomes larger, the varistor is vulnerable to the leakage current, but has an effect on the electrostatic component.

Accordingly, it is possible to make the varistor have an effect on the leakage current by decreasing the capacitance value of the varistor, and a bead may be provided at a front end of the varistor to correct its vulnerability to the electrostatic component (that is, as the capacitance value of the varistor becomes larger, its capacity is increased, and through charging of electricity and then slow discharging of the electricity, the varistor has an effect on the electrostatic component, while as the capacitance value of the varistor becomes smaller, its capacity is decreased, and thus the electricity is not changed, but the discharge is immediately performed to make the varistor be vulnerable to the electrostatic component).

Further, the conversion unit 131 and the switching unit 132 can be connected in series.

Figure 2:
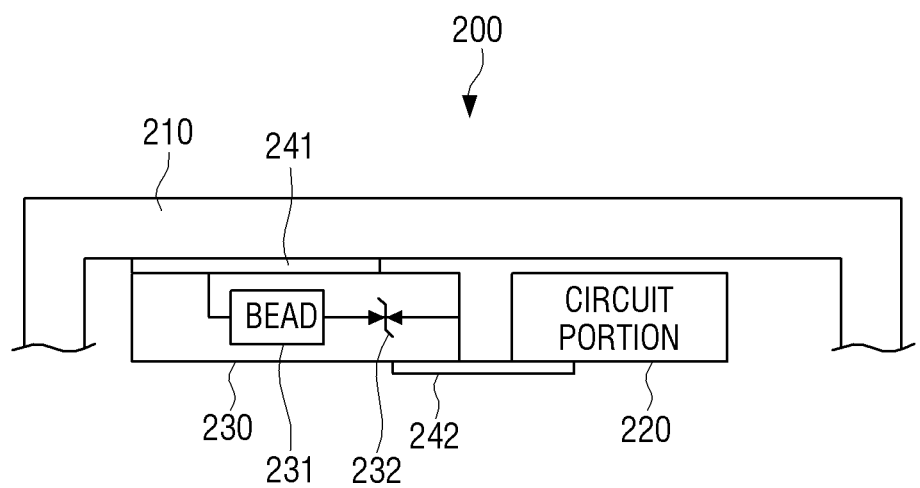
FIG. 2 is a cross-sectional view illustrating an electronic device according to an embodiment of the present general inventive concept.

FIG. 2 is a cross-sectional view illustrating an electronic device according to an embodiment of the present general inventive concept. Referring to FIG. 2, the electronic device 200 includes an exterior portion 210, a circuit portion 220, a protection circuit portion 230, and conductive tapes 241 and 242. With respect to elements illustrated in FIG. 2 that are identical to elements illustrated in FIG. 1, duplicate descriptions thereof will be omitted.

The exterior portion 210 may include a metal case of a conductive material designed to encase the circuit portion 220 and the protection circuit portion 230. With regard to a notebook computer, for example, the metal case may be a metal case that forms an exterior surface of the notebook computer.

The exterior portion 210 is formed of a conductive metal case, and transfers the electrostatic component from a charged human body or machine to the protection circuit portion 230 and the circuit portion 220.

The exterior portion 210 is connected to the protection circuit portion 230 through the conductive tape 241. If the exterior portion 210 is not connected through the conductive tape 241, the electrostatic component that is applied to the exterior portion 210 of the conductive material is not discharged, and an electromagnetic field is generated on the surface of the exterior portion 210 of the conductive material to cause the occurrence of signal distortion on a PCB. Further, if a user physically approaches the exterior portion 210 of the conductive material in a state where electric charge on the exterior portion 210 of the conductive material has not been discharged, the electric charge on the exterior portion of the conductive material may cause secondary discharge to be transferred to the user, resulting in a shock.

The circuit portion 220 is provided inside the exterior portion 210, and includes circuit elements to operate the electronic device 100. The circuit portion 220 is connected to the protection circuit portion 230 through the conductive tape 242.

The protection circuit portion 230 is connected to the exterior portion 210 and the circuit portion 220 through the conductive tapes 241 and 242.

The protection circuit portion 230 may be mounted on a sub-board provided separately from the circuit portion 220 that is mounted on a main board, and may be connected to the circuit portion 220 on the main board and the exterior portion 210 through the conductive tapes 241 and 242. That is, referring to FIG. 2, since the protection circuit portion 230 is mounted on the sub-board provided separately from the circuit portion 220, it is easy to attach and/or detach the protection circuit portion 230 during an after-sales service and to use the protection circuit portion 230 in any compatible electronic device.

Further, the protection circuit portion 230 is connected in series to the bead 231 and the varistor 232.

If the electrostatic component that flows through the exterior portion 210 is applied through the conductive tape 241, the bead 231 lowers the voltage level and transfers the lowered electrostatic component to the varistor 232.

When the electrostatic component flows through the bead 231, the varistor 232 acts as a conductor, and transfers the applied electrostatic component to the ground of the circuit portion 220 through the conductive tape 242. Accordingly, the ground of the circuit portion 220 discharges the flowing electrostatic component to an area outside the electronic device 200 via the ground of the adaptor (not illustrated). If the circuit portion 220 does not include the ground, the varistor 232 may be directly connected to the ground of the adaptor (not illustrated) to discharge the flowing electrostatic component to the area outside the electronic device 200 via the ground of the adaptor.

Further, before the electrostatic component flows through the bead 231, the varistor 232 acts as a nonconductor and prevents the leakage current that is generated from an area inside the circuit portion 220 or the leakage current that flows through the ground of the adaptor (not illustrated) connected to the ground of the circuit portion 220 from flowing into the exterior portion 210.

Although FIG. 2 illustrates that the bead 231 and the varistor 232 are connected in series in the protection circuit portion 230, the connection therebetween is not limited thereto, and various other configurations are also possible.

More specifically, other configurations may include a series connection between a resistor and a varistor, a series connection between an inductor and a varistor, a series connection between an RL circuit in which a resistor and an inductor are connected in parallel and a varistor, a series connection between a resistor and a diode (an anode of the diode is connected to the resistor, and a cathode of the diode is connected to the circuit portion 220), a series connection between an inductor and a diode (an anode of the diode is connected to the inductor, and a cathode of the diode is connected to the circuit portion 220), a series connection between a bead and a diode (an anode of the diode is connected to the bead, and a cathode of the diode is connected to the circuit portion 220), and a series connection between an RL circuit in which a resistor and an inductor are connected in parallel and a diode (an anode of the diode is connected to the RL circuit, and a cathode of the diode is connected to the circuit portion 220).

According to the electronic device 200 as illustrated in FIG. 2, since the protection circuit portion 230 is provided therein, external ESD/surge is minimized, and a leakage current that occurs inside a system is prevented from flowing to the exterior portion 210 of the conductive material and affecting the user.

Figure 3:
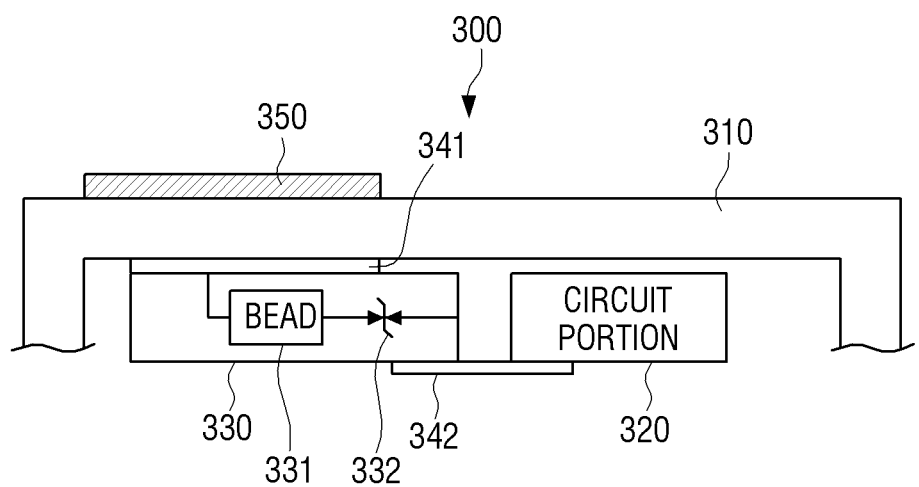
FIG. 3 is a cross-sectional view illustrating an electronic device according to another embodiment of the present general inventive concept.

FIG. 3 is a cross-sectional view of an electronic device 300 according to another embodiment of the present general inventive concept. Referring to FIG. 3, the electronic device 300 includes a plastic case 310, a circuit portion 320, a protection circuit portion 330, conductive tapes 341 and 342, and a metal exterior member 350. With respect to elements illustrated in FIG. 3 that are identical to elements illustrated in FIGS. 1 and 2, duplicate descriptions thereof will be omitted. However, unlike the electronic devices 100 and 200 of FIGS. 1 and 2 respectively, the electronic device 300 according to the embodiment as illustrated in FIG. 3 includes the plastic case 310 that surrounds the circuit portion 320 and the protection circuit portion 330.

The plastic case 310 surrounds the circuit portion 320 and the protection circuit portion 330. With regard to a notebook computer, for example, the plastic case 310 may be a case that forms an exterior surface of the notebook computer. Since the plastic case 310 has weak conductivity, it is used as a case of the electronic device 300 to prevent the ESD.

However, referring to FIG. 3, the electronic device 300 includes a metal exterior member 350 that is attached to the plastic case 310 surrounding the circuit portion 320 and the protection circuit portion 330, and thus is affected by the electrostatic component. That is, the metal exterior member 350 includes a conductive material that is attached to the plastic case 310 for aesthetic or other purposes.

Specifically, the metal exterior member 350 is formed of a conductive material, and may have an electrical property due to the electrostatic component that is generated from the charged human body or machine. As such, the electrostatic component that is applied to the metal exterior member 350 of the conductive material is not discharged through the plastic case 310 having weak conductivity. Accordingly, an electromagnetic field is generated on the metal exterior member 350 of the conductive material, and the electrostatic component is transferred to the protection circuit portion 330 and the circuit portion 320.

The circuit portion 320 is provided inside the plastic case 310, and includes circuit elements to operate the electronic device 300. As illustrated in FIG. 3, the circuit portion 320 is connected to the protection circuit portion 330 through the conductive tape 342.

The protection circuit portion 330 is connected to the plastic case 310 and the circuit portion 320 through the conductive tapes 341 and 342, respectively.

Referring to FIG. 3, the protection circuit portion 330 is mounted on a sub-board provided separately from the circuit portion 320 that is mounted on a main board, and is connected to the circuit portion 320 on the main board and the exterior portion 310 through the conductive tapes 341 and 342, respectively.

Further, referring to FIG. 3, since the protection circuit portion 330 is provided separately from the circuit portion 320, it is easy to attach and/or detach the protection circuit portion 330 during an after-sales service and to use the protection circuit portion 330 compatible in any electronic device.

Further, the protection circuit portion 330 is connected in series to the bead 331 and the varistor 332.

If the electromagnetic field that is generated through the metal exterior member 350 is applied through the conductive tape 341, the bead 331 lowers the voltage level and transfers the lowered electromagnetic field to the varistor 332.

Specifically, the metal exterior member 350 is formed of a conductive material, and may have an electrical property due to the electrostatic component that is generated from the charged human body or machine. As such, the electrostatic component that is applied to the metal exterior member 350 of the conductive material is not discharged through the plastic case 310 having weak conductivity. Accordingly, an electromagnetic field is generated on the metal exterior member 350 of the conductive material, and the effects of the electromagnetic field can be transferred to the circuit portion 320 using the bead 331 and the varistor 332 of the protection circuit portion 330.

When the electromagnetic field component flows through the bead 331, the varistor 332 acts as a conductor, and transfers the applied electrostatic component to the ground of the circuit portion 320 through the conductive tape 342. In this case, the ground of the circuit portion 320 discharges the flowing electrostatic component to an area outside the electronic device 300 via the ground of the adaptor (not illustrated). If the circuit portion 320 does not include the ground, the varistor 332 may be directly connected to the ground of the adaptor (not illustrated) to discharge the flowing electrostatic component be discharged to the are outside the electronic device 300 via the ground of the adaptor.

Further, before the electrostatic component flows through the bead 331, the varistor 332 acts as a nonconductor and prevents the leakage current that is generated from the inside of the circuit portion 320 or the leakage current that flows through the ground of the adaptor (not illustrated) connected to the ground of the circuit portion 320 from flowing into the metal exterior member 350.

Although FIG. 3 illustrates that the bead 331 and the varistor 332 are connected in series in the protection circuit portion 330, the connection therebetween is not limited thereto, and various other configurations are also possible.

More specifically, other configurations may include a series connection between a resistor and a varistor, a series connection between an inductor and a varistor, a series connection between an RL circuit in which a resistor and an inductor are connected in parallel and a varistor, a series connection between a resistor and a diode (an anode of the diode is connected to the resistor, and a cathode of the diode is connected to the circuit portion 320), a series connection between an inductor and a diode (an anode of the diode is connected to the inductor, and a cathode of the diode is connected to the circuit portion 320), a series connection between a bead and a diode (an anode of the diode is connected to the bead, and a cathode of the diode is connected to the circuit portion 320), and a series connection between an RL circuit in which a resistor and an inductor are connected in parallel and a diode (an anode of the diode is connected to the RL circuit, and a cathode of the diode is connected to the circuit portion 320).

According to the electronic device 300 as illustrated in FIG. 3, since the protection circuit portion 330 is provided therein, an external electromagnetic field component effect due to the metal exterior member 350 that is formed on an upper portion of the plastic case is minimized, and a leakage current that occurs inside a system is prevented from flowing to the metal exterior member 350 of the conductive material and affecting the user.

Figure 4:
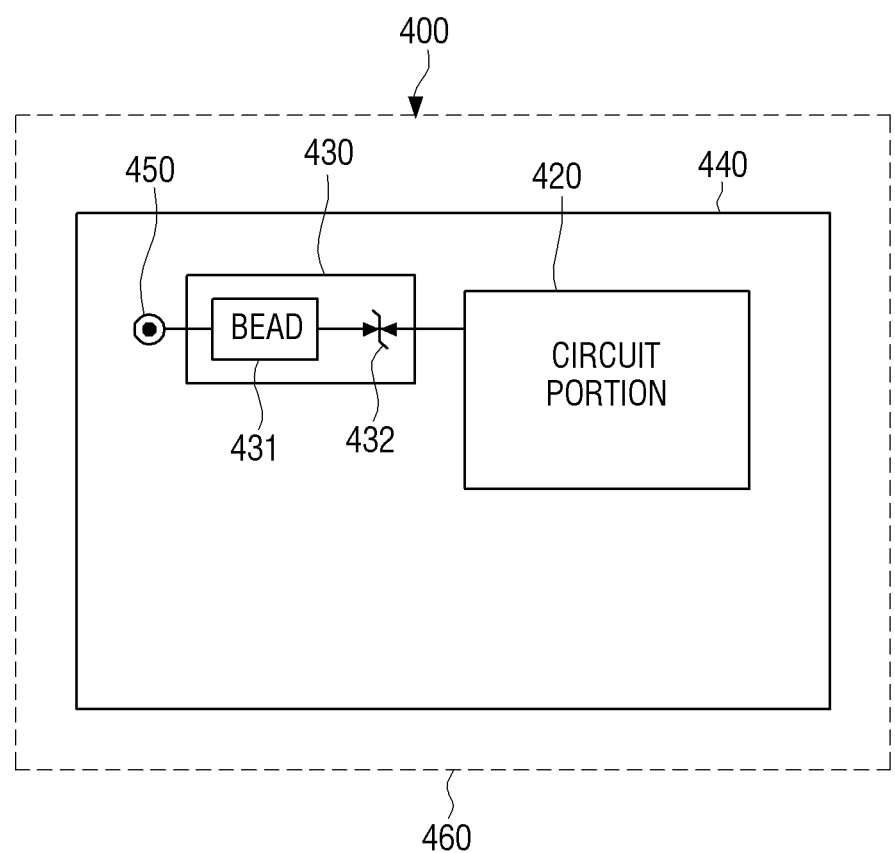
FIG. 4 is a cross-sectional view illustrating an electronic device according to another embodiment of the present general inventive concept.

FIG. 4 is a cross-sectional view of an electronic device 400 according to another embodiment of the present general inventive concept. Referring to FIG. 4, the electronic device 400 includes a circuit portion 420, a protection circuit portion 430, a main board 440, a plastic encapsulated microcircuit (PEM) 450, and an exterior portion 460. With respect to elements illustrated in FIG. 4 that are identical to elements illustrated in FIGS. 1 through 3, duplicate descriptions thereof will be omitted.

However, unlike the electronic devices 100, 200, and 300 illustrated in FIGS. 1, 2, and 3, respectively, the electronic device 400 illustrated in FIG. 4 includes the protection circuit portion 430 and the circuit portion 420 mounted together on one main board 440.

The PEM 450 connects and fixes the exterior portion 460 to the main board 440.

Specifically, the PEM 450 is provided with a screw hole, and can fix and connect the exterior portion 460 and the main board 440.

Here, the exterior portion 460 that is connected to the PEM 450 may be a metal case or a plastic case to which the metal exterior member 350 of FIG. 3 is attached.

Further, the PEM 450 is connected to the protection circuit portion 430.

The protection circuit portion 430 is connected to the PEM 450 and the circuit portion 420.

Further, the protection circuit portion 430 is connected in series to the bead 431 and the varistor 432.

If the electrostatic component that flows through the exterior portion 460 and the PEM 450 is applied, the bead 431 lowers the voltage level and transfers the lowered electrostatic component to the varistor 432.

When the electrostatic component flows through the bead 431, the varistor 432 acts as a conductor, and transfers the applied electrostatic component to the ground of the circuit portion 420. As such, the ground of the circuit portion 420 discharges the flowing electrostatic component to an area outside the electronic device 400 via the ground of the adaptor (not illustrated). If the circuit portion 420 does not include the ground, the varistor 432 may be directly connected to the ground of the adaptor (not illustrated) to discharge the flowing electrostatic component to the area outside the electronic device 400 via the ground of the adaptor.

Further, before the electrostatic component flows through the bead 431, the varistor 432 acts as a nonconductor and prevents a leakage current that is generated from an area inside of the circuit portion 420 or the leakage current that flows through the ground of the adaptor (not illustrated) connected to the ground of the circuit portion 420 from flowing into the exterior portion 460.

Although FIG. 4 illustrates that the bead 431 and the varistor 432 are connected in series in the protection circuit portion 430, the connection therebetween is not limited thereto, and various other configurations are also possible.

More specifically, other configurations may include a series connection between a resistor and a varistor, a series connection between an inductor and a varistor, a series connection between an RL circuit in which a resistor and an inductor are connected in parallel and a varistor, a series connection between a resistor and a diode (an anode of the diode is connected to the resistor, and a cathode of the diode is connected to the circuit portion 420), a series connection between an inductor and a diode (an anode of the diode is connected to the inductor, and a cathode of the diode is connected to the circuit portion 420), a series connection between a bead and a diode (an anode of the diode is connected to the bead, and a cathode of the diode is connected to the circuit portion 420), and a series connection between an RL circuit in which a resistor and an inductor are connected in parallel and a diode (an anode of the diode is connected to the RL circuit, and a cathode of the diode is connected to the circuit portion 420).

On the main board 440, the protection circuit portion 430 and the circuit portion 420 are mounted together. That is, according to the electronic device 400 of FIG. 4, the protection circuit portion 430 is not separately provided on a sub-board, but is provided on one main board 440 together with the circuit portion 420.

According to the electronic device 400 of FIG. 4, where the exterior portion 460 of the conductive material is provided, the effects of the external ESD/surge are minimized, and a leakage current that occurs inside the system is prevented from flowing to the exterior portion 460 of the conductive material and affecting the user.

FIG. 5A is a graph illustrating the correlation between a capacitance of a varistor and a leakage current.

As illustrated in FIG. 5A, as the capacitance value of the varistor increases, the flowing leakage current becomes larger.

That is, if the capacitance value of the varistor becomes smaller, the varistor has an effect on the leakage current, but is vulnerable to the electrostatic component. In contrast, if the capacitance value of the varistor increases, the varistor becomes susceptible to the leakage current, but has an effect on the electrostatic component.

In order to effectively intercept the leakage current, the capacitance value of the varistor is not limited, but it is preferable that the varistor has capacitance that is equal to or less than 5 pF.

FIG. 5B is a graph illustrating a voltage value applied to the varistor according the existence or nonexistence of the bead.

The left side of FIG. 5B indicates a voltage level of the varistor when the ESD is applied to the exterior portion of the electronic device 100 in a state where the bead is connected in series with the varistor, and the right side of FIG. 5B indicates a voltage level of the bead when the ESD is applied to the exterior portion of the electronic device 100 via application of the varistor without the bead.

As illustrated in FIG. 5B, due to the serial connection of the bead with the varistor, the level of the voltage that is applied to the varistor is decreased.

As illustrated in FIG. 5A, if the capacitance value of the varistor becomes smaller, the varistor becomes susceptible to the ESD. However, by connecting the bead in series, the level of the voltage that is applied to the varistor is decreased, and thus the damage of the varistor can be prevented with a small capacitance value of the varistor.

As described above, according to the diverse embodiments of the present general inventive concept, where the exterior portion of the conductive material is provided, an external ESD/surge is minimized, and a leakage current that occurs inside a system is prevented from flowing to an exterior portion of a conductive material and affecting a user.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. An electronic device, comprising:
   an exterior portion made of a conductive material;
   a circuit portion disposed within the exterior portion and including circuit elements and a processor to perform functions of the electronic device; and
   a varistor to prevent a leakage current that flows from the circuit portion toward the exterior portion from flowing into the exterior portion and to transfer an electrostatic component input thereto via the exterior portion to a ground of the circuit portion, and
   a conversion unit to reduce a voltage level of the electrostatic component and to transfer the voltage-reduced electrostatic component to the varistor, the varistor and the conversion unit being connected in series, the conversion unit is one of a bead, a resistor, and an RL circuit having a resistor and an inductor connected in parallel,
   wherein ground of the circuit portion is configured to discharge the voltage-reduced electrostatic component to an area outside the electronic device by way of a ground of an adapter, and
   wherein the varistor and the conversion unit are connected to the circuit portion on a main board and the exterior portion.

2. The electronic device as claimed in claim 1, wherein the circuit portion is mounted on the main board, and the varistor and the conversion unit are mounted on a sub-board provided separately from the main board and connected to the circuit portion on the main board and the exterior portion through a conductive tape.

3. The electronic device as claimed in claim 1, wherein the circuit portion, the varistor, and the conversion unit are mounted together on the main board, and the varistor and the conversion unit are connected in series between a plastic encapsulated microcircuit (PEM) and the circuit portion on the main board, wherein the PEM connects the exterior portion and the main board.

4. The electronic device as claimed in claim 1, wherein the exterior portion is a metal case that surrounds the circuit portion and the protection circuit portion.

5. The electronic device as claimed in claim 1, wherein the exterior portion is a metal exterior member attached to a plastic case surrounding the circuit portion and the protection circuit portion.

6. The electronic device as claimed in claim 1, wherein the varistor has capacitance equal to or less than 5 pF.

7. A board usable in an electronic device, comprising:
a protection circuit portion disposed within an exterior portion of a conductive material forming an exterior of the electronic device to be in contact with and connected between a circuit portion disposed within the electronic device including circuit elements and a processor to perform functions of the electronic device and the exterior portion of the conductive material forming the exterior of the electronic device, the protection circuit portion comprising:
a varistor to prevent a leakage current that flows from the circuit portion toward the exterior portion from flowing into the exterior portion and to transfer an electrostatic component input thereto via the exterior portion to a ground of the circuit portion, and
a conversion unit to reduce a voltage level of the electrostatic component and to transfer the voltage-reduced electrostatic component to the varistor, the varistor and the conversion unit being connected in series, the conversion unit is one of a bead, a resistor, and an RL circuit having a resistor and an inductor connected in parallel,
wherein ground of the circuit portion is configured to discharge the voltage-reduced electrostatic component to an area outside the electronic device by way of a ground of an adapter, and
wherein the varistor and the conversion unit are connected to the circuit portion on a main board and the exterior portion.

8. The board as claimed in claim 7, wherein the exterior portion is one of a metal case that surrounds the circuit portion and the varistor, the conversion unit, and a metal exterior member attached to a plastic case surrounding the circuit portion and the protection circuit portion.

9. The board as claimed in claim 7, wherein the varistor has a capacitance equal to or less than 5 pF.

10. An electronic device, comprising:
a circuit portion disposed within the electronic device and including a processor to perform functions of the electronic device; and
a protection circuit portion disposed within an exterior portion of the electronic device to be in contact with and coupled between the exterior portion of the electronic device and the circuit portion, comprising:
a conversion unit to reduce a voltage of an electrostatic component received from the exterior portion, the conversion unit is one of a bead, a resistor, and an RL circuit having a resistor and an inductor connected in parallel, and
a varistor to direct the electrostatic component with the reduced voltage to a ground of the circuit portion, and to intercept a leakage current that flows from the circuit portion toward the exterior portion from flowing into the exterior portion,
wherein ground of the circuit portion is configured to discharge the voltage-reduced electrostatic component to an area outside the electronic device by way of a ground of an adapter, and
wherein the conversion unit and the varistor are connected in series, and
wherein the varistor and the conversion unit are connected to the circuit portion on a main board and the exterior portion.

11. The electronic device of claim 10, wherein the exterior portion comprises a conductive material on at least a portion thereof.

12. The electronic device of claim 10, further comprising:
a plastic encapsulated microcircuit (PEM) to couple the main board to the external portion,
wherein the circuit portion and the protection circuit are mounted on the main board.

* * * * *

UNITED STATES PATENT AND TRADEMARK OFFICE
CERTIFICATE OF CORRECTION

PATENT NO. : 9,801,316 B2  Page 1 of 1
APPLICATION NO. : 13/599026
DATED : October 24, 2017
INVENTOR(S) : Jae-sub Youn It is certified that error appears in the above-identified patent and that said Letters Patent is hereby corrected as shown below:

On the Title Page

Item [30] (Foreign Application Priority Data), Line 24:
Delete "2011-0090376" and insert -- 10-2011-0090376 --, therefore.

Signed and Sealed this
Nineteenth Day of December, 2017

Joseph Matal
*Performing the Functions and Duties of the*
*Under Secretary of Commerce for Intellectual Property and*
*Director of the United States Patent and Trademark Office*